United States Patent [19]

Kimura

[11] Patent Number: 5,057,717
[45] Date of Patent: Oct. 15, 1991

[54] LOGARITHMIC AMPLIFIER CIRCUIT
[75] Inventor: Katsuji Kimura, Tokyo, Japan
[73] Assignee: NEC Corporation, Tokyo, Japan
[21] Appl. No.: 647,829
[22] Filed: Jan. 30, 1991
[30] Foreign Application Priority Data Feb. 1, 1990 [JP] Japan .................................. 2-24074

[51] Int. Cl.$^5$ .................... G06F 7/556; G06F 7/24
[52] U.S. Cl. .................................. 307/492; 328/145
[58] Field of Search ................ 328/145, 142, 26, 32; 307/492; 330/252

[56] References Cited

U.S. PATENT DOCUMENTS

| 4,442,549 | 4/1984 | Main | 307/492 |
| 4,680,553 | 7/1987 | Kimura et al. | 330/2 |
| 4,972,512 | 11/1990 | Garskamp | 307/492 |
| 4,990,803 | 2/1991 | Gilbert | 328/145 |

FOREIGN PATENT DOCUMENTS 62-292010 12/1987 Japan .

Primary Examiner—Timothy P. Callahan
Attorney, Agent, or Firm—Helfgott & Karas

[57] ABSTRACT

A logarithmic amplifier circuit has n (n>1) stages of differential amplifiers, n+1 in number, of rectifying circuits, a differential pair of bipolar transistors having different emitter sizes in the ratio of 1/J (J>1) and a differential pair of MOS transistors of which the ratio of a gate-width and a gate-length W/L is 1/K (K>1). The bipolar transistors and the MOS transistors form an output pair. A collector of one of the bipolar transistors having a larger emitter size and a drain of one of MOS transistors having a larger W/L ratio are connected together, and a collector of the other of bipolar transistors having a smaller emitter size and a drain of the other of MOS transistors having a smaller W/L ratio are connected together. A subtraction circuit outputs a difference in the currents flowing in each of the output pair and outputs from all the subtraction circuits are added up at a common load resistor. The arrangement enables the realization of a highly accurate logarithmic amplifier circuit which operates at a low power supply voltage and has a wide dynamic range.

8 Claims, 4 Drawing Sheets

LOGARITHMIC AMPLIFIER CIRCUIT

BACKGROUND OF THE INVENTION

The present invention relates to a logarithmic amplifier circuit and, more particularly, to a logarithmic amplifier circuit suited for use in a video frequency amplifier or an intermediate frequency amplifier of radio equipment.

A conventional logarithmic amplifier circuit of a kind to which the present invention relates and which is realized by a bipolar integrated circuit is disclosed in, for example, U.S. Pat. No. 4,680,553. Also, one realized by a MOS integrated circuit is disclosed in, for example, Japanese Patent Application Kokai No. Sho 62(1987)-292,010.

The circuit disclosed in the former, that is, U.S. Pat. No. 4,680,553, is a logarithmic amplifier circuit of a type well known as being a continuous detecting system. The intermediate frequency amplifier comprises a plurality, n stages (n>1), of amplifying units connected in cascade, each unit being of differential amplifier formed by bipolar transistors. To each input of the respective stages of the amplifying units and an output of the final stage amplifying unit are connected a plurality, that is, n+1 in number, of full-wave rectifiers (detectors) made up of paired biopolar transistors. The outputs from the respective full-wave rectifiers are substantially of hyperbolic functions and, these outputs are connected so as to be added together thereby producing a logarithmic output.

The logarithmic output is such that, since the dynamic range of the input signal level results in being compressed, it can easily be shown by a signal intensity or strength even when a measuring instrument with a small dynamic range, such as an ordinary voltmeter, is used.

The information disclosed in the former also covers that relating to means for improving a dynamic range for input signal in which, in order to enhance the accuracy of logarithmic characteristics, a resistor is inserted to each emitter of the paired bipolar transistors constituting the above-mentioned full-wave rectifiers.

The logarithmic amplifier circuit disclosed in the latter, that is, Japanese Patent Application Kokai No. Sho 62(1987)-292,010, relates also as in the former to a logarithmic amplifier circuit of a well known continuous detecting type. Here, the transistors used therein are MOS transistors and an intermediate frequency amplifier is formed by a plurality, n stages, of MOS transistor differential circuits connected in cascade. To each input of the respective stages and the output of the final stage are connected respectively two pairs of the MOS transistors of which the ratio of W/L, that is, the ratio of gate-width W to the gate-length L, is 1/K (K>1), in which the outputs are opposite to each other, and in which the drains of the MOS transistors whose ratio W/L are the same are connected together whereby a full-wave rectifier is formed. In this configuration, the logarithmic output results from the arrangement wherein all of the same phase outputs of two pairs of differentially paired transistors (n+1 in number) are connected together or in common.

As to the conventional logarithmic amplifier circuits referred to above, the means as explained hereunder have been used in an attempt to enhance the accuracy of logarithmic characteristics but there are accompanying problems.

First, in the case of bipolar integrated circuits, there have been problems, as pointed out in, for example, the U.S. Pat. No. 4,680,553 referred to above. That is, since high accuracy of logarithmic characteristics is due to the expansion of an input dynamic range obtained in exchange of the reduction in the gain in the rectifier by the insertion of emitter resistors in the differential pair transistors constituting the rectifier, it has been necessitated to raise the power supply voltage in order to compensate the voltage drop caused by such emitter resistors.

Secondly, in the case of MOS integrated circuits, there have also been problems in that, in order to obtain high accuracy of logarithmic characteristics, it has been necessitated to keep the gain per stage low or small and to increase the number of stages of the differential amplifiers constituting a unit amplifier since each of the stages has square characteristics. This of course results in an increase in the scale of circuit and in the consumption of power.

SUMMARY OF THE INVENTION

An object of the present invention is to provide a logarithmic amplifier circuit which is capable of operating at a low power supply voltage and has high accuracy in logarithmic output characteristics with a wide dynamic range.

The present invention provides in one aspect an improved logarithmic amplifying circuit which has a plurality, n stages (n>1), of differential amplifiers connected in cascade and a plurality, n+1 in number, of rectifying circuits each connected to an input of each stage and an output of a final stage of the differential amplifiers, the rectifying circuits each comprising:

a differential pair of bipolar transistors of which the ratio of emitter sizes is 1/J (J>1);

a differential pair of MOS transistors of which the ratio of a gate-width to a gate-length W/L is 1/K (K>1);

the bipolar transistors and the MOS transistors forming an output pair by being arranged such that a collector of one of the bipolar transistors having a larger emitter size and a drain of one of the MOS transistors having a larger W/L ratio are connected together and a collector of the other of the bipolar transistors having a smaller emitter size and a drain of the other of the MOS transistors having a smaller W/L ratio are connected together; and a subtraction circuit for outputting a difference in the currents flowing in each of the output pair;

the rectifying circuits having in common an adding means for adding up outputs from all of the subtraction circuits.

According to the present invention, the outputs of the rectifying circuits are of a combination of hyperbolic characteristics and square-law full-wave rectifying characteristics, the former characteristics resulting from the differential pairs of bipolar transistors having different emitter size ratio of 1/J (J>1) and the latter characteristics resulting from the differential pairs of MOS transistors having the W/L ratio, that is, gate-width W to gate-length L, of 1/K (K>1). The addition of such respective outputs enables the realization of a highly accurate logarithmic amplifier circuit which can operate at a low power supply voltage and has a wide dynamic range.

BRIEF DESCRIPTION OF THE DRAWINGS

The above and other objects, features and advantages of the present invention will be apparent from the following description of preferred embodiment according to the invention explained with reference to the accompanying drawings, in which.

PREFERRED EMBODIMENT OF THE INVENTION

Figure 1:
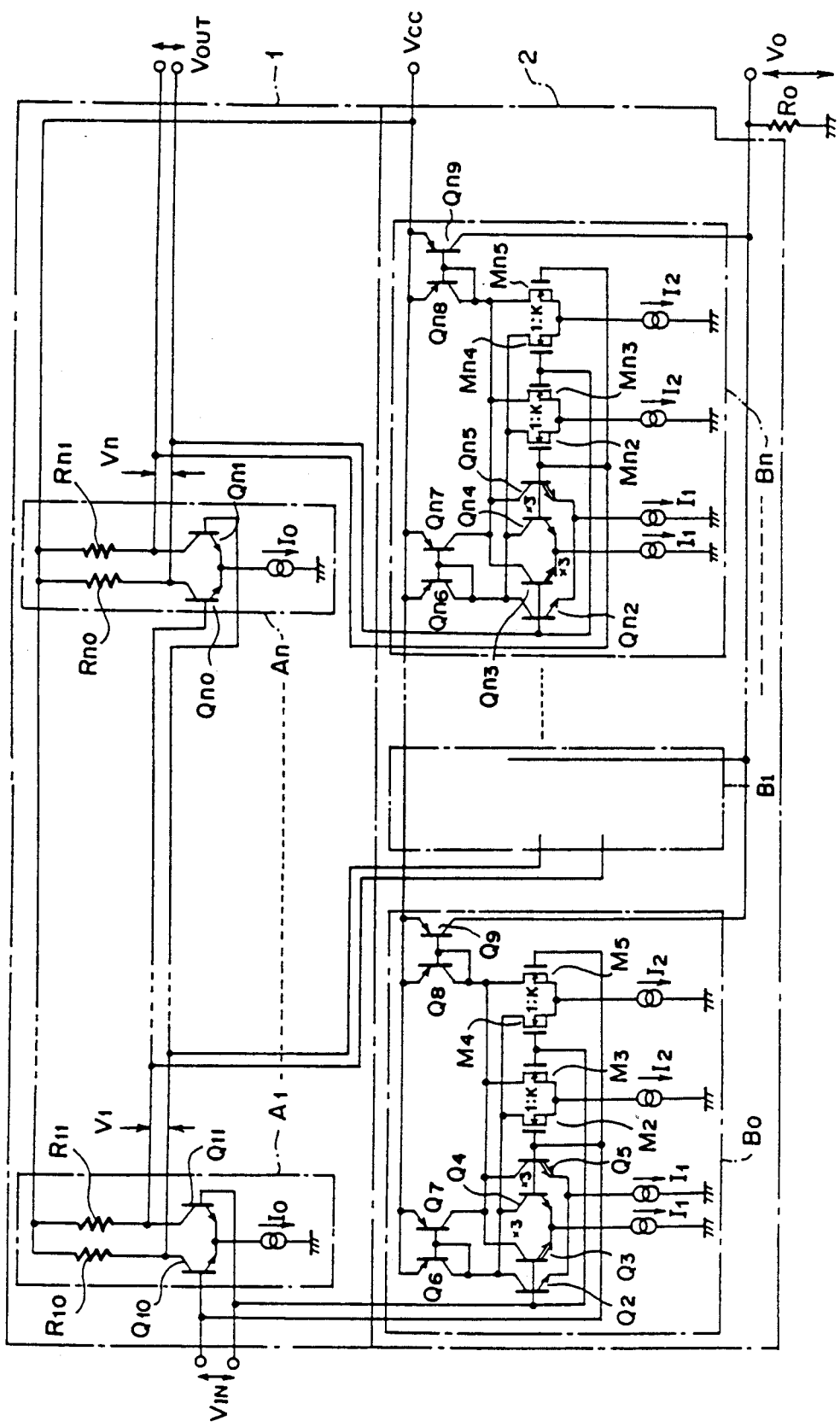
FIG. 1 is a circuit diagram showing a logarithmic amplifier circuit of one embodiment according to the present invention.

With reference to FIG. 1, an embodiment of the present invention is shown in a circuit diagram. The logarithmic amplifier circuit according to this embodiment includes an amplifying portion 1 having n stages of differential amplifiers $A_l, \ldots, A_n$ connected in cascade and a logarithmic portion 2 having n+1 stages of artificial pseudo-logarithmic full-wave rectifier circuits $B_0, B_1, \ldots, B_n$ for receiving and performing logarithmic conversion of input signals or output signals from each of the differential amplifiers.

Each of the artificial pseudo-logarithmic full-wave rectifier circuits $B_0, \ldots, B_n$ has two pairs of differentially paired bipolar transistors (hereinafter referred to as "bipolar differential pairs") whose emitter size ratio is 1/J (J>1), two pairs of differentially paired MOS transistors (hereinafter referred to as "MOS differential pairs") whose W/L ratio, W being the gate-width and L being the gate-length, is 1/K (K>1) and two current mirror circuits for outputting a difference of the load currents of these four differential pairs.

Next, the operation of the logarithmic amplifier circuit of this embodiment is explained.

First, of the artificial pseudo-logarithmic full-wave rectifier circuits $B_0, \ldots, B_n$, only $B_0$ is referred to for this explanation.

Each of the bipolar differential pairs Q4, Q3 and Q2, Q5 has the emitter size ratio of 1:3 and has a constant current source $I_1$ at its emitter side.

Assuming that the DC amplification factor of the bipolar transistor is approximately 1, the collector current $I_{c2}, \ldots, I_{c5}$ of each of the transistors Q2, ..., Q5 of the bipolar differential pairs will be expressed as follows:

$$I_{c2}=I_1/\{1+3 \exp (V_{IN}/V_T)\} \quad (1)$$

$$I_{c3}=I_1/\{1+\tfrac{1}{3} \exp (V_{IN}/V_T)\} \quad (2)$$

$$I_{c4}=I_1/\{1+3 \exp (-V_{IN}/V_T)\} \quad (3)$$

$$I_{c5}=I_1/\{1+\tfrac{1}{3} \exp (-V_{IN}/V_T)\} \quad (4)$$

wherein $V_{IN}$ is an input signal voltage and $V_T$ is kT/q (k: Bolzmann constant, T: absolute temperature, and q: unit electron charge).

A pair of bipolar transistors Q8, Q7 and a pair of bipolar transistors Q8, Q9 at the side of the collectors of the above explained differential pairs respectively form known current mirror circuits. Further, the collector current $I_{C9}$ of the bipolar transistor Q9 is an output current of the artificial pseudo-logarithmic full-wave rectifier circuit $B_0$.

Assuming that the output current of the bipolar differential pairs is $I_{ROB}$ and the output current of the MOS differential pairs is $I_{ROM}$, the output current $I_{C9}$ of the rectifier circuit $B_0$ will be expressed by the following equation (5):

$$I_{C9}=I_{ROB}+I_{ROM} \quad (5)$$

From the above equations (1) through (4), the output current $I_{ROB}$ of the bipolar pairs will be hyperbolic functions as expressed by the following equation (6):

$$\begin{aligned}I_{ROB} &= (I_{c3} + I_{c5}) - (I_{c4} + I_{c2}) \\ &= 16 I_1/[10 + 3\{\exp(V_{IN}/V_T) + \exp(-V_{IN}/V_T)\}]\end{aligned} \quad (6)$$

On the assumption that the ratios of gate-width W to the gate-length L of the MOS transistors M2, ..., M5 of the MOS differential pairs are respectively W2/L2, ..., W5/L5, the drain current Id2, ..., Id5 of the MOS transistors M2, ..., M5 will be expressed by the following equations:

$$Id2=\mu n(Cox/2)(W2/L2)(Vgs2-Vt)^2 \quad (7)$$

$$Id3=\mu n(Cox/2)(W3/L3)(Vgs3-Vt)^2 \quad (8)$$

$$Id4=\mu n(Cox/2)(W4/L4)(Vgs4-Vt)^2 \quad (9)$$

$$Id5=\mu n(Cox/2)(W5/L5)(Vgs5-Vt)^2 \quad (10)$$

Here, $$Id2+Id3=Id4+Id5=I2 \quad (11)$$

$$V_{IN}=Vgs2-Vgs3=Vgs5-Vgs4 \quad (12)$$

wherein $\mu n$ is mobility of a MOS transistor, Cox is capacitance per unit area of a gate oxide layer and Vt is a threshold voltage.

Here, when $$\beta=\mu n(Cox/2)(W2/L2) \quad (13)$$

the output current $I_{ROM}$ of the MOS differential pairs will have square-law full-wave rectifying characteristics with respect to the input signal $V_{IN}$ as may be shown by the following equation:

$$I_{ROM}=2(1-1/K)\{(1+1/K)I2-2\beta V_{IN}^2\}/(1+1/K)^2 \quad (14)$$

Here.

$$(W3/L3)/(W2/L2)=(W5/L5)/(W4/L4)=K(>1) \quad (15)$$

Figure 2:
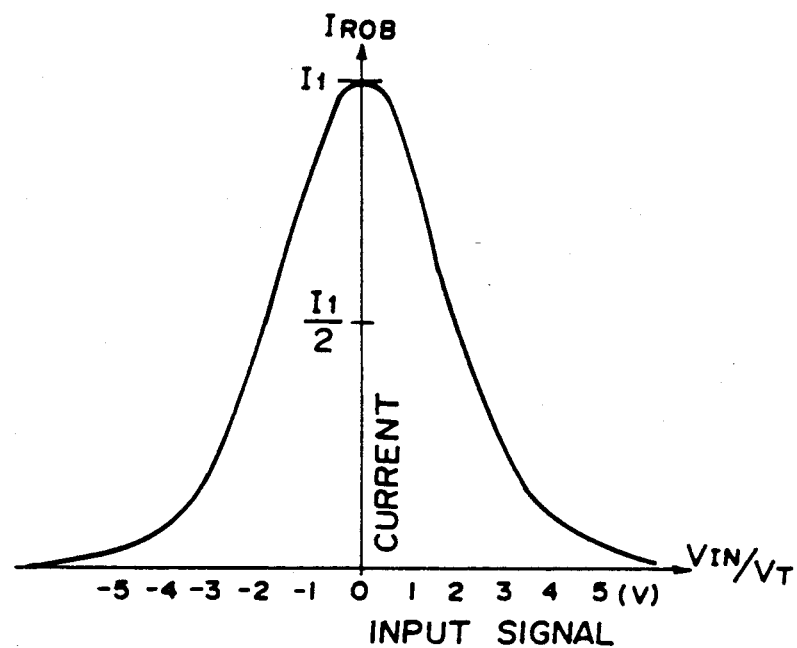
FIG. 2 is a graph showing a characteristic curve of an output current from a differential pair of bipolar transistors.
Figure 3:
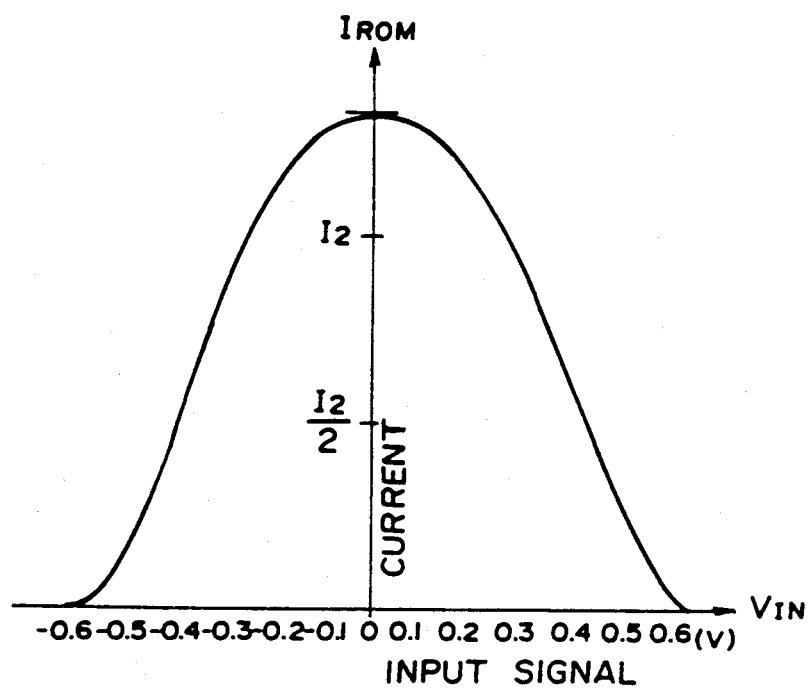
FIG. 3 is a graph showing a characteristic curve of an output current from a differential pair of MOS transistors.

As results of the above calculations, FIG. 2 shows the output current $I_{ROB}$ of the bipolar differential pairs and FIG. 3 shows the output current $I_{ROM}$ of the MOS differential pairs.

Figure 4:
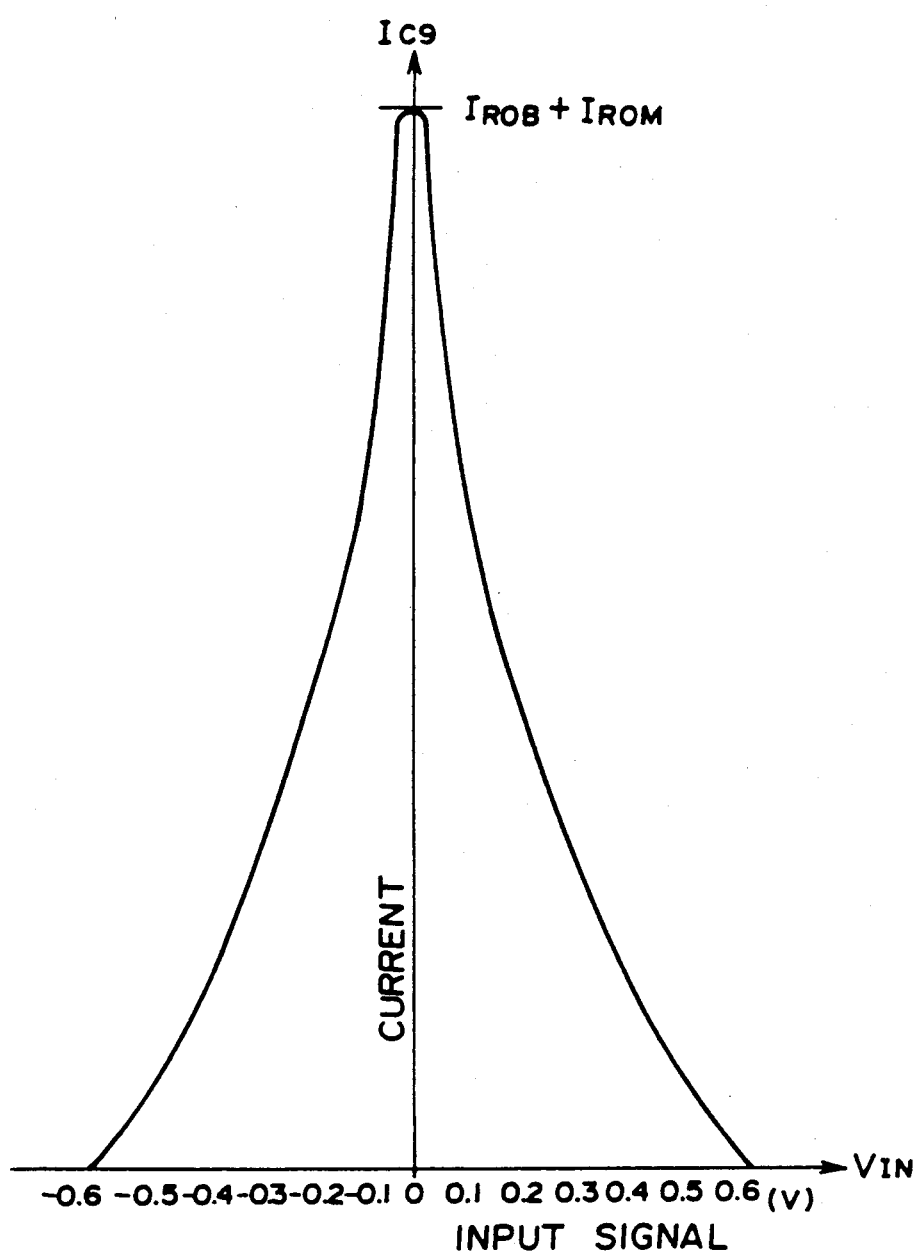
FIG. 4 is a graph showing a characteristic curve of a current representing the sum of the currents shown in FIG. 2 and FIG. 3.

Further, the output current $I_{C9}$ of the artificial pseudo-logarithmic full-wave rectifier circuit $B_0$ is shown in FIG. 4 as the sum of both the currents by the addition of the current $I_{ROB}$ of FIG. 2 and the current $I_{ROM}$ of FIG. 3 and is seen as having approximate or artificial logarithmic characteristics.

With respect to other remaining artificial pseudo-logarithmic full-wave rectifier circuits $B_1, \ldots, B_n$, the output currents $I_{C19}, \ldots, I_{Cn9}$ are obtained respectively in the same way as explained above.

Now, assuming that the gain and the output signal level at each stage of the differential amplifiers $A_1, \ldots, A_n$ connected in cascade are $g_1, \ldots, g_n$ and $V_1, \ldots, V_n$ ($=V_{OUT}$), respectively, each of the input signal levels applied to the respective artificial pseudo-logarithmic full-wave rectifier circuits $B_1, \ldots, B_n$ becomes $g_1V_{IN}, \ldots, g_1g_2 \ldots g_nV_{IN}$ and, with an increase in the level of the input signal $V_{IN}$, the saturation takes place in a serial order from the output voltage $V_{OUT}$ to the input voltage $V_1$ applied to the rectifier circuit $B_1$.

The output current $I_0$ of the logarithmic amplifier circuit after the output currents of the respective artificial pseudo-logarithmic full-wave rectifier circuits $B_0, \ldots, B_n$ having been added up may be shown by the following equation (18):

$$I_0 = I_{C9} + I_{C19} + \ldots + I_{Cn9} \qquad (16)$$

Figure 5:
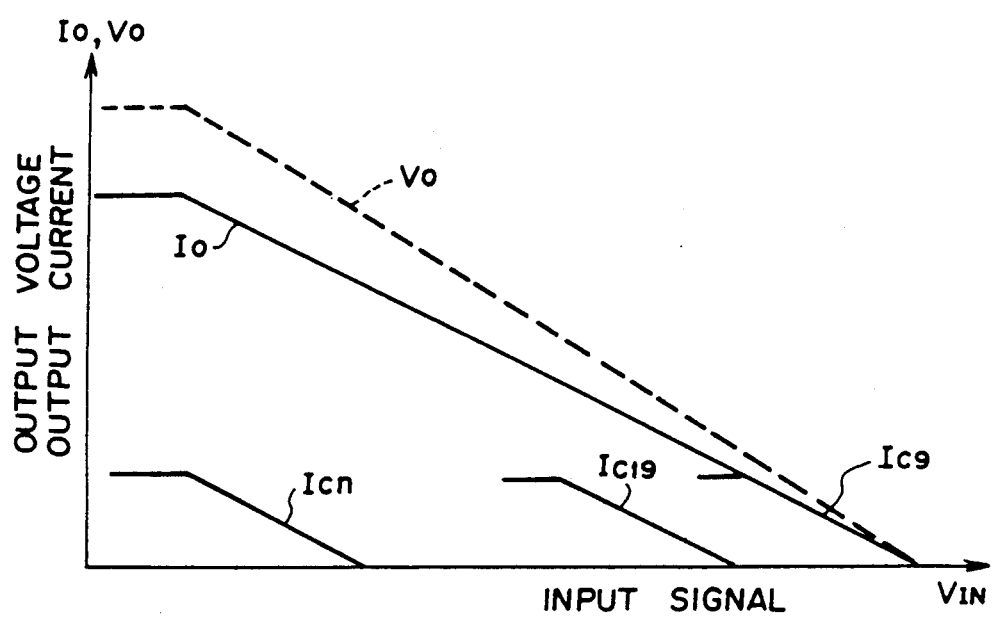
FIG. 5 is a graph showing characteristic curves of an output current and an output voltage of the logarithmic amplifier circuit according to the invention.

Therefore, the output voltage $V_0$ of the logarithmic amplifier circuit will be expressed as follows:

$$V_0 = R_0 \times I_0 \qquad (17)$$

wherein $R_0$ is a load resistor of the logarithmic amplifier circuit, which is commonly provided for the respective artificial pseudo-logarithmic full-wave rectifier circuits $B_0, \ldots, B_n$. FIG. 5 shows characteristic curves of the output current $I_0$ and the output voltage $V_0$ obtained from the above equations.

In FIG. 1, when the voltage across the base-emitter of the respective bipolar transistors is 0.7 V and the threshold voltage Vt of the respective MOS transistors is 0.7 V, the power supply voltage $V_{Cc}$ may be approximately 2 V which enables the circuit to operate, thereby resulting in the realization of a low voltage operation.

Also, as to the input signal level $V_{IN}$ applied to the artificial pseudo-logarithmic full-wave rectifier circuit, the operation is possible without involving saturation to approximately ±0.6 V, which enables to realize with accuracy the logarithmic characteristics in a high dynamic range.

In the foregoing explanation, the transistors Q8 ... Q9 to Qn6 ... Qn9 in the current mirror circuits, for example, in FIG. 1 are referred to as bipolar transistors but of course MOS transistors can function in the same way.

Further, it is possible to arrange that the current mirror circuits comprising the transistors Q6, ..., Q9 within the artificial pseudo-logarithmic full-wave rectifier circuit $B_0$ be used commonly for all of the remaining artificial pseudo-logarithmic full-wave rectifier circuits $B_1, \ldots, B_n$ and in this way the necessary number of the transistors employed can be reduced.

According to the present invention, the outputs of the artificial pseudo-logarithmic full-wave rectifier circuits which are added up are of a combination of hyperbolic characteristics and square-law full-wave rectifying characteristics, the former characteristics resulting from the differential pairs of bipolar transistors having different emitter sizes of 1/J (J>1) and the latter characteristics resulting from the differential pairs of MOS transistors having the W/L ratio, that is, gate-width W to gate-length L, of 1/K (K>1). The invention thus enables the realization of a highly accurate logarithmic amplifier circuit which operates under a low power supply voltage and has a wide dynamic range.

A MOS transistor accompanies large 1/f noises and its noise characteristics are inferior as compared with those of a bipolar transistor. Therefore, at least as the first stage amplifying unit $A_1$, use of the bipolar transistor enables to obtain a better NF (in input conversion). In this manner, it is possible to lower the minimum level of the input signal thereby to ensure the maintenance of a wider dynamic range.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. A logarithmic amplifier circuit having a plurality, n stages (n>1), of differential amplifiers connected in cascade and a plurality, n+1 in number, of rectifying circuits each connected to an input of each stage and an output of a final stage of said differential amplifiers, said rectifying circuits each comprising:
   a differential pair of bipolar transistors of which the ratio of emitter sizes is 1/J (J>1);
   a differential pair of MOS transistors of which the ratio of a gate-width and a gate-length W/L is 1/K (K>1);
   said bipolar transistors and said MOS transistors forming an output pair by being arranged such that a collector of one of said bipolar transistors having a larger emitter size and a drain of one of said MOS transistors having a larger W/L ratio are connected together and a collector of the other of said bipolar transistors having a smaller emitter size and a drain of the other of said MOS transistors having a smaller W/L ratio are connected together; and
   subtraction circuit for outputting a difference in the currents flowing in each of said output pair;
   said rectifying circuits having in common an adding means for adding outputs from all of said subtraction circuits.

2. A logarithmic amplifier circuit according to claim 1, in which said bipolar differential transistors are in two pairs with their outputs being opposite with each other and collectors of said bipolar differential transistors having emitters of the same size are connected together, and said MOS differential transistors are in two pairs with their outputs being opposite with each other and drains of said MOS differential transistors having the same W/L ratio therebetween are connected together.

3. A logarithmic amplifier circuit according to claim 1, in which the sizes of emitters of said bipolar differential transistors are in the ratio of 1:3.

4. A logarithmic amplifier circuit according to claim 2, in which the sizes of emitters of said bipolar differential transistors are in the ratio of 1:3.

5. A logarithmic amplifier circuit according to claim 1, in which said subtraction circuit comprises two pairs of differentially connected transistors.

6. A logarithmic amplifier circuit according to claim 5, in which said transistors are of bipolar type.

7. A logarithmic amplifier circuit according to claim 5, in which said transistors are of MOS type.

8. A logarithmic amplifier circuit according to claim 5 1, in which said n stages of differential amplifiers are such that at least a first stage is of a differential amplifier having bipolar transistors.

* * * * *